United States Patent
Ksendzov et al.

(10) Patent No.: US 6,690,687 B2
(45) Date of Patent: Feb. 10, 2004

(54) TUNABLE SEMICONDUCTOR LASER HAVING CAVITY WITH RING RESONATOR MIRROR AND MACH-ZEHNDER INTERFEROMETER

(75) Inventors: Alexander Ksendzov, La Crescenta, CA (US); Randy Dean May, Montrose, CA (US)

(73) Assignee: SpectraSensors, Inc., Altadena, CA (US)

( * ) Notice: Subject to any disclaimer, the term of this patent is extended or adjusted under 35 U.S.C. 154(b) by 434 days.

(21) Appl. No.: 09/753,285

(22) Filed: Jan. 2, 2001

(65) Prior Publication Data

US 2002/0085609 A1 Jul. 4, 2002

(51) Int. Cl.⁷ .................................................. H01S 3/10
(52) U.S. Cl. .............................. 372/20; 372/92; 372/94; 372/32
(58) Field of Search ............................. 372/20, 32, 92, 372/98, 93, 94

(56) References Cited

U.S. PATENT DOCUMENTS

| | | | |
|---|---|---|---|
| 4,468,773 A | | 8/1984 | Seaton |
| 4,689,794 A | | 8/1987 | Brosnan |
| 4,731,795 A | * | 3/1988 | Clark et al. .................. 372/107 |
| 4,796,270 A | * | 1/1989 | Sheng et al. .................. 372/54 |
| 4,955,027 A | | 9/1990 | Piper |
| 4,982,406 A | | 1/1991 | Facklam |
| 5,212,711 A | * | 5/1993 | Harvey et al. ................. 372/94 |
| 5,257,276 A | | 10/1993 | Forouhar |
| 5,267,256 A | | 11/1993 | Saruwatari |
| 5,444,724 A | * | 8/1995 | Goto ........................... 372/20 |
| 5,509,022 A | | 4/1996 | Lowery |
| 5,546,414 A | | 8/1996 | Pfeiffer |
| 5,561,684 A | * | 10/1996 | Martin ........................ 372/107 |
| 5,627,648 A | | 5/1997 | Garrett |
| 5,633,883 A | | 5/1997 | Shi |

(List continued on next page.)

OTHER PUBLICATIONS

Yvonne Carts–Powell, Silicon FP interferometer provides tuning and Filtering for DWDM, WDM Solutions, Jun. 2001.

(List continued on next page.)

Primary Examiner—Leon Scott, Jr.
(74) Attorney, Agent, or Firm—Carl A. Kukkonen, III

(57) ABSTRACT

A semiconductor laser is provided having a cavity including a gain chip, a Mach-Zehnder wide tuning port, and a ring resonator mirror. Optical signals generated by the gain chip propagate through the Mach-Zehnder wide tuning port and into the ring resonator mirror where the optical signals are reflected back through the Mach-Zehnder wide tuning port to the gain chip. The ring resonator is configured to reflect only those optical signals back into the laser cavity having wavelengths within a set of sharp peaks and the laser cavity therefore can resonate only within one of the sharp peaks. The ring resonator mirror is heated to adjust its dimensions so as to maintain one of the sharp peaks at a selected emission wavelength. As optical signals reflected from the ring resonator pass through the Mach-Zehnder wide tuning port, the signals are split between two channels of differing lengths resulting in optical interference. The optical interference limits the ability of the laser cavity to resonate at wavelengths other than near the center of a single broad peak determined by the relative lengths of the two channels. The Mach-Zehnder wide tuning port is heated to vary the relative lengths of the two channels so as to maintain the single broad peak at the selected transmission wavelength. In this manner, the laser cavity is controlled to resonate substantially only at the selected wavelength. Resonance at the other sharp resonance peaks permitted by the ring resonator is significantly reduced, thereby significantly reducing transmission sidebands generated by the laser.

48 Claims, 6 Drawing Sheets

U.S. PATENT DOCUMENTS

| | | | |
|---|---|---|---|
| 5,706,301 A | | 1/1998 | Lagerstrom |
| 5,798,859 A | | 8/1998 | Colbourne |
| 6,078,418 A | | 6/2000 | Hansen |
| 6,088,142 A | | 7/2000 | Cao |
| 6,093,838 A | * | 7/2000 | Vasudevan et al. ......... 549/467 |
| 6,101,200 A | | 8/2000 | Burbidge |
| 6,122,301 A | | 9/2000 | Tei |
| 6,125,128 A | | 9/2000 | Mizrahi |
| 6,134,253 A | | 10/2000 | Munks |
| 6,151,340 A | | 11/2000 | Rivers |
| 6,178,002 B1 | * | 1/2001 | Mueller-Wirts ............. 356/491 |
| 6,181,717 B1 | | 1/2001 | Kner |
| 6,222,861 B1 | | 4/2001 | Kuo |
| 6,240,109 B1 | | 5/2001 | Shieh |
| 2001/0048783 A1 | * | 12/2001 | Herble et al. ................. 385/16 |
| 2001/0050794 A1 | * | 12/2001 | Brindel et al. .............. 359/176 |
| 2002/0085595 A1 | * | 7/2002 | Ksendzov et al. ............ 372/20 |
| 2002/0085609 A1 | * | 7/2002 | Ksendzov et al. ............ 372/94 |
| 2002/0126386 A1 | * | 9/2002 | Jordan et al. ............... 359/577 |

OTHER PUBLICATIONS

T. Niemi et al., Wavelength monitoring of multi–channel DWDM–systems using a single temperature–tunable Fabry–Perot filter, Unknown.

Don G. Peterson & Amnon Yariv, Interferometry and Laser Control with solid Fabry–Perot Etalons, Applied Optics, Jun. 1966, vol. 5, No. 6.

Tapio Niemi et al.,Tunable Silicon Etalon for Simultaneous Spectral Filtering and Wavelength . . . IEEE Photonics.Technology Letters, Jan. 2001,vol. 13,No. 1.

Tatsuno et al., 50 GHz Spacing, Multi–Wavelength Tunable Locker . . . , Unknown.

Kazarinov et al, Narrow–Band Resonant Optical Reflectors and Resonant Optical Transformers for Laser Stabilization and Wavelength Division Multiplexing, IEEE Journal of Quantum Electronics, vol QE–23, No. 9, Sep. 1987.

* cited by examiner

TUNABLE SEMICONDUCTOR LASER HAVING CAVITY WITH RING RESONATOR MIRROR AND MACH-ZEHNDER INTERFEROMETER

BACKGROUND OF THE INVENTION

I. Field of the Invention

The invention generally relates to tunable lasers and in particular to tunable lasers for use in a dense wavelength division multiplexers (DWDM).

II. Description of the Related Art

A DWDM is a device for simultaneously transmitting a set of discrete information channels over a single fiber optic transmission line. A conventional fiber optic transmission line is capable of reliably transmitting signals within a bandwidth of 1280 to 1625 nanometers (nm), the "low loss" region for silica fiber. Within that overall bandwidth, the International Telecommunications Union (ITU) has defined various transmission bands and specified certain transmission channel protocols for use within each transmission band. One example of a transmission band is the ITU "C" band, which extends 40 nm from 1525 nm to 1565 nm. Within the C band, specific transmission channel protocols of 40, 80, or 160 discrete channels are defined and, for each protocol, the ITU has defined a grid of transmission wavelengths, with each line corresponding to an acceptable transmission wavelength. For the 40 channel protocol, the corresponding ITU grid has 40 lines with channel spacing of 0.8 nm; for the 80 channel protocol, the corresponding ITU grid has 80 lines with channel spacing of 0.4 nM; and so forth. The protocols have been defined to ensure that all DWDM transmission and reception equipment is fabricated to operate at the same wavelengths. Other exemplary ITU transmission bands are the S- and L-bands.

To simultaneously transmit the set of channels on a fiber optic cable, the DWDM employs a set of the individual lasers, with one laser per channel. FIG. 1 illustrates a DWDM 100 having forty individual lasers 102 for transmitting optical signals via a single optic fiber 104. An optical multiplexer 106 couples signals received from the individual lasers via a set of intermediate optic fibers 107 into output optic fiber 104. Each laser transmits at a different wavelength of the forty channel ITU C band. This enables forty separate channels of information to be transmitted via the single optical fiber 104 to a de-multiplexer (not shown) provided at the far end of the optical fiber.

To permit the DWDM to transmit forty separate channels simultaneously, each individual laser must be tuned to a single ITU transmission channel wavelength. Preferably, widely tunable lasers (WTLs) are employed as the transmission lasers to permit any of the individual lasers to be tuned to any of the ITU channels. The wide tunability is achieved by choosing the amplifying medium with a wide gain curve (typically a semiconductor structure) and configuring the WTL in such a way that low cavity loss is only achieved at a narrow wavelength region. The WTL is tuned by changing the aforementioned peak in the spectral response of the cavity to operate at a particular resonant wavelength aligned with a selected one of the ITU channel wavelengths. The desire to achieve low bit error rate leads to requirements for high spectral purity of the emitted light which is usually stated in terms of the side mode suppression, i.e. the ratio of the light intensity emitted by the WTL at the side band wavelength to the intensity of the main mode. While the requirements may differ from system to system, typically for reliable operation of a DWDM transmitting ITU channels, the side mode suppression should be 30 decibels (dB) or better. Such requirements often are not easily reconciled with the wide tunability, particularly with relatively inexpensive WTLs. Furthermore, while monolithic semiconductor WTLs, currently the state of the art devices, provide the necessary degree of miniaturization and ruggedness, tuning of such devices involves a complicated tuning pattern. That is, tuning currents are applied to multiple sections of the laser and their influence on the emitted wavelength and spectral purity is not independent.

Accordingly, it would be desirable to provide an improved WTL capable of being more easily, precisely and reliably tuned to a selected wavelength and in particular to provide an improved WTL capable of meeting the aforementioned 30 dB sideband requirement for use within DWDMs transmitting at ITU channel wavelengths. It is to these ends that the invention is primarily directed.

SUMMARY OF THE INVENTION

In accordance with a one aspect of the invention, a semiconductor laser is provided having a cavity comprising gain chip, an interferometric wide tuning port, and a ring resonator mirror. The gain chip provides radiant energy and amplification for resonance within the cavity. The ring resonator mirror limits resonance within the cavity to a set of sharp resonance peaks. The interferometric wide tuning port, which may be a Mach-Zehnder interferometer, selects one resonance peak out of the aforementioned set of peaks based on a wide tuning profile having a broad peak. The wide tuning port is configured to align a wavelength of the broad peak of the wide tuning profile near a selected wavelength. The ring resonator mirror is configured to align a wavelength of one of the sharp peaks also near the selected wavelength. In this manner, the laser cavity resonates primarily at the selected emission wavelength. Other sharp resonant peaks permitted by the ring resonator are filtered by the wide tuning port so as to substantially limit the amplitudes thereof. Hence, transmission sidebands of the laser are substantially reduced. With appropriate selection of components, the side bands may be limited to amplitudes 30 dB below the selected transmission wavelength.

In an exemplary embodiment, the gain chip is formed of III/IV material. The Mach-Zehnder wide tuning port and the ring resonator mirror are formed on a silicon tuning chip utilizing rib-loaded planar wave guides with silicon oxynitride core and silicon dioxide claddings. An output optical channel of the gain chip is coupled to an input optical channel of the Mach-Zehnder wide tuning port. The Mach-Zehnder wide tuning port includes a splitter for splitting the input channel into a pair of channels of differing lengths and a combining section for combining the pair of optical channels into a single output channel. The single output channel of the Mach-Zehnder wide tuning port is coupled to an input channel of the ring resonator mirror. The ring resonator mirror also includes a splitter for splitting the input optical channel into a pair of parallel channels. A ring-shaped channel is formed between the pair of parallel channels with portions of the ring-shaped optical channel sufficiently close to the pair of parallel channels to permit evanescent coupling.

With this configuration, optical signals generated by the gain chip propagate through the Mach-Zehnder wide tuning port and into the ring resonator. Optical signals of certain wavelengths are reflected back into the Mach-Zehnder wide tuning port and ultimately are reflected again by the gain chip, thereby permitting resonance at those wavelengths and limiting resonance at other wavelengths, resulting in the aforementioned sharp resonance peaks. The wavelengths reflected by the ring resonator depend upon the length of the ring. The ring resonator is heated, or otherwise controlled, to vary the dimensions and the refractive index of the ring so as to maintain one of the sharp peaks at a selected transmission wavelength, such as at a particular ITU channel wavelength. As the optical signals reflected between the ring resonator and the gain chip propagate back and forth through the Mach-Zehnder wide tuning port, the signals are split between the two channels of differing lengths in the wide tuning port resulting in optical interference. The optical interference limits the ability of the laser cavity to resonate at wavelengths wherein destructive interference occurs. As a result, resonance is substantially limited to within a broad peak determined by the relative lengths of the two channels. The Mach-Zehnder wide tuning port is heated, or otherwise controlled, to vary the relative lengths and refractive indexes of the two channels so as to maintain the broad peak at the selected transmission wavelength. In this manner, only one of the sharp resonant peaks permitted by the ring resonator is also aligned with the broad peak of the wide tuning port. Other sharp resonant peaks permitted by the ring resonator, representing sidebands, are substantially reduced by the interference provided by the wide tuning port or are at wavelengths otherwise not generated by the gain chip. Hence, the laser cavity resonates primarily only near one wavelength, namely the selected wavelength. The amplitudes of the sideband wavelengths are thereby greatly limited. Resonance within the laser cavity generates coherent light which is output from the gain chip for use as a transmission signal. The signal may be modulated to encode digital information. By limiting the amplitudes of the sidebands to, for example, 30 dB below the amplitude of the selected transmission wavelength, a data transmission error rate can be reduced to as low as $10^{-9}$ or below.

Other embodiments, features and advantages of the invention will be discussed below.

BRIEF DESCRIPTION OF THE DRAWINGS

The features, objects, and advantages of the invention will become more apparent from the detailed description set forth below when taken in conjunction with the drawings in which like reference characters identify correspondingly throughout and wherein.

DETAILED DESCRIPTION OF THE EXEMPLARY EMBODIMENTS

Figure 2:
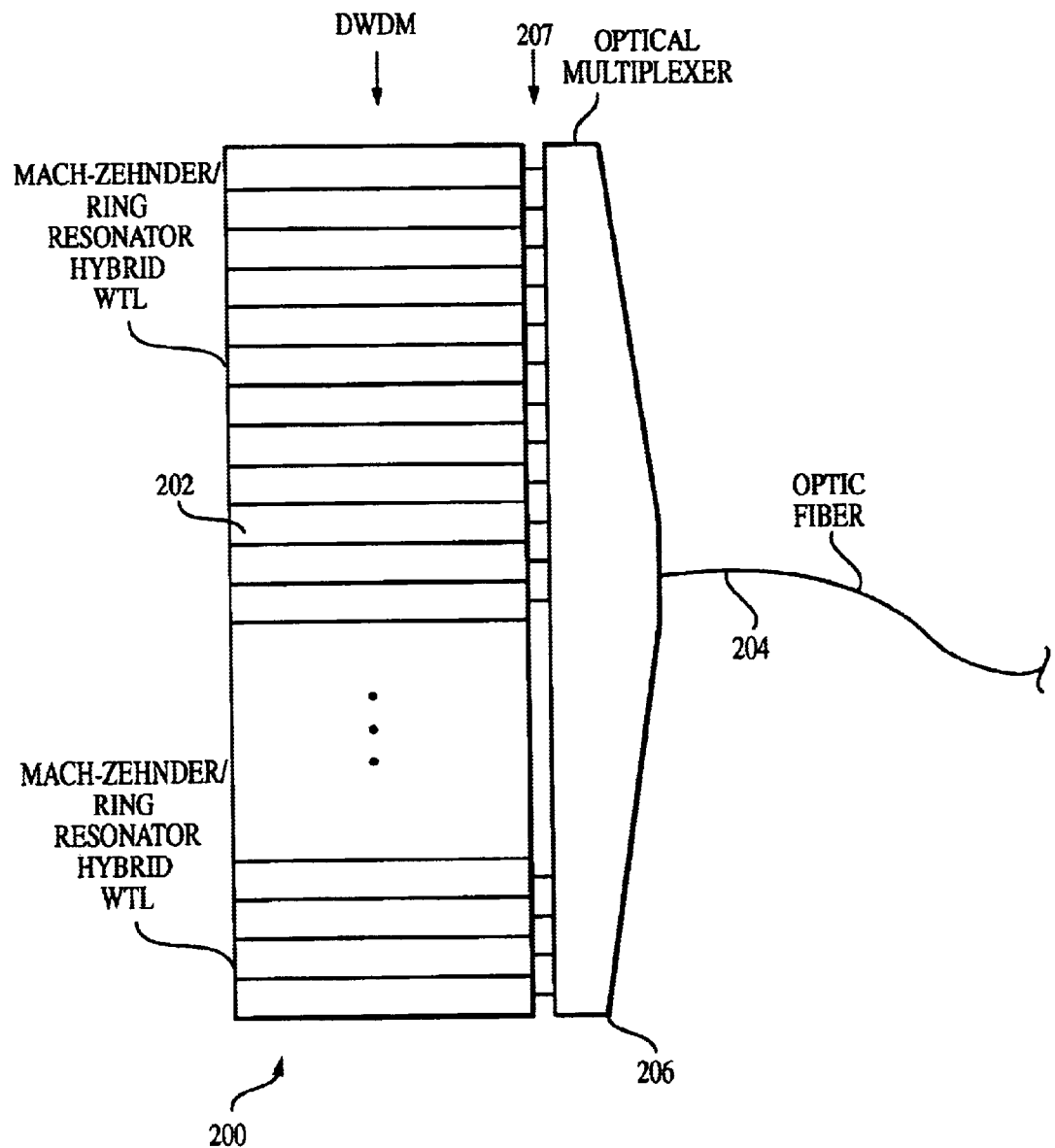
FIG. 2 illustrates a DWDM having hybrid WTLs configured in accordance with a first exemplary embodiment of the invention.

With reference to the remaining figures, exemplary embodiments of the invention will now be described. FIG. 2 illustrates a DWDM 200 having forty individual hybrid WTLs 202 for transmitting optical signals on forty ITU C-band channels via a single optic fiber 204. An optical multiplexer 206 couples signals received from the individual hybrid WTLs via a set of intermediate optic fibers 207 into output optic fiber 204 to a de-multiplexer (not shown) provided at the far end of the optical fiber. Each hybrid WTL is tuned to transmit optical signals at a wavelength selected from the forty channel ITU C band for use in optically transmitting signals along output optic fiber 204. The signals may be, for example television signals, telephone signals, computer network signals etc. Typically, each WTL is tuned to transmit at a different one of the wavelengths so that the DWDM can transmit signals at any of the forty wavelengths of the C band, thereby taking full advantage of the bandwidth available within the C band. In any case, each of the hybrid WTLs is configured so as to automatically maintain the wavelength of transmitted signals at a selected C band channel wavelength despite power fluctuations, changes in temperature, or other factors. Moreover, each of the hybrid WTLs is configured so as to ensure that transmission sidebands of the WTL are less than some predetermined acceptable level, typically 30 dB, thereby ensuring an acceptable signal transmission error rate of, for example, $10^{-9}$. The features of the hybrid WTL will now be described in detail with reference to the remaining figures, wherein an overview of the configuration and operation of the hybrid WTL is provided with reference to FIGS. 3–6 and wherein a specific structural implementation of a tuning chip of the hybrid WTL is described with reference to FIGS. 7 and 8.

Figure 3:
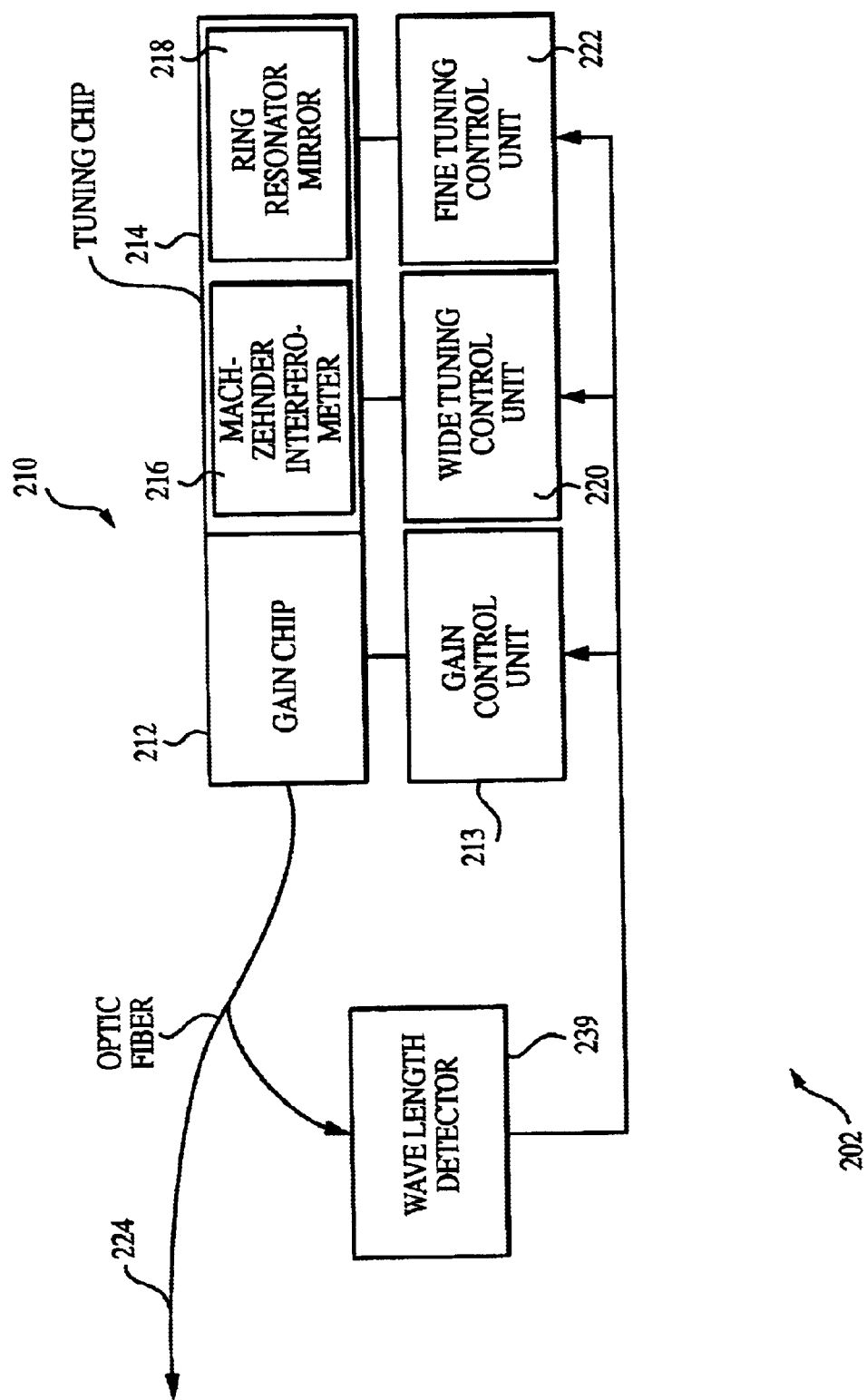
FIG. 3 is a block diagram illustrating one of the hybrid WTL of FIG. 2 having a laser cavity with a Mach-Zehnder interferometer and a ring resonator mirror.

FIG. 3 illustrates one of the hybrid WTLs 202. WTL 202 includes a laser cavity 210 formed from a gain chip 212 and a tuning chip 214. The gain chip is a III/IV material semiconductor chip. The tuning chip is a silicon semiconductor chip. The gain chip operates under the control of a gain control unit 213 which controls the gain chip to generate light or other radiant energy for coupling into the tuning chip. In the specific example described herein, the gain chip is controlled to generated light having a wavelength somewhere within a tuning range of about 10 nm near a selected channel of the ITU C band, which ranges from 1525 nm to 1565 nm. In the absence of the tuning chip, the wavelength may vary throughout the tuning range depending on the current applied to the gain chip by the gain control unit. Tuning chip 214 includes a Mach-Zehnder interferometer portion 216 and a ring resonator mirror portion 218. The Mach-Zehnder interferometer operates as a wide tuning port under control of a wide tuning control unit 220 to limit resonance within the laser cavity to within a wide tuning profile having a single broad peak within the gain curve of the gain chip. The ring resonator mirror 218 operates as a fine tuning device under control of a fine tuning unit 222 to limit resonance within the laser cavity to within a set of sharp resonant peaks within the tuning range of the gain chip.

Figure 4:
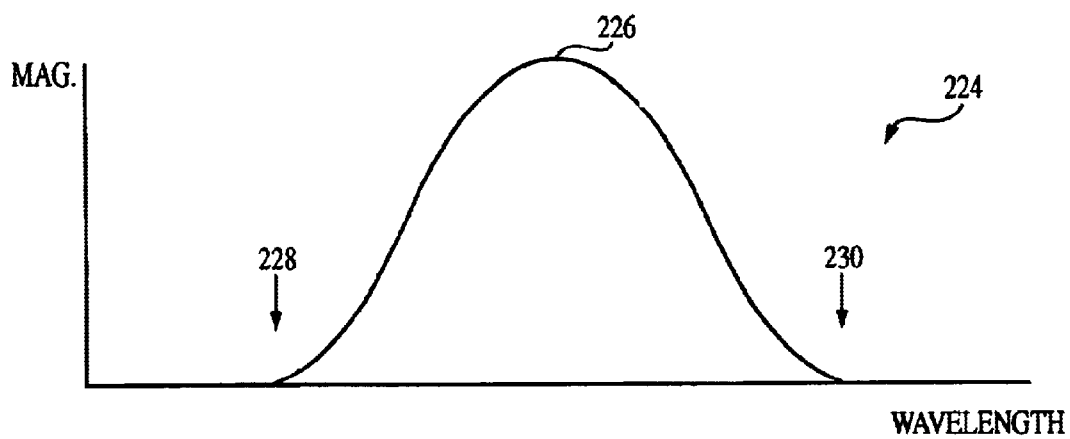
FIG. 4 is a graph illustrating a wide tuning profile achieved by the Mach-Zehnder interferometer of the WTL of FIG. 3.

The wide tuning profile generated by the Mach-Zehnder interferometer is shown in FIG. 4 and is substantially sinusoidal. Only that portion of the sinusoidal profile lying within the tuning range of the gain chip is shown. As can be seen, wide tuning profile 224 has a broad center peak 226

Figure 5:
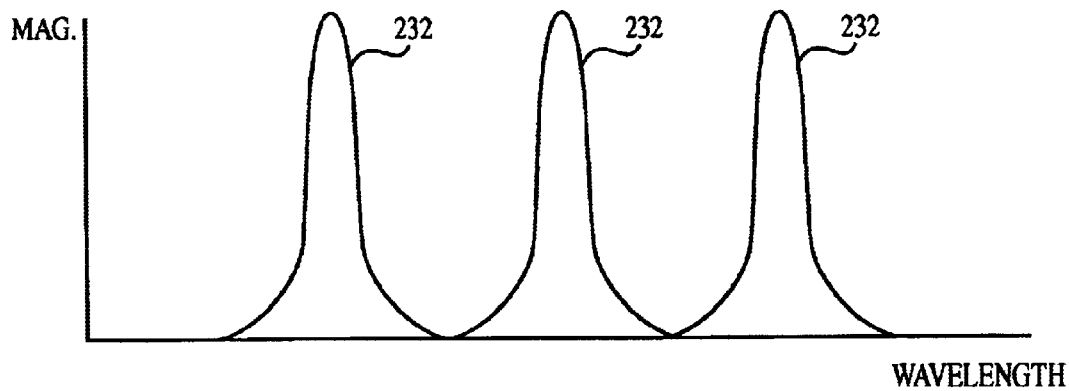
FIG. 5 is a graph illustrating a set of narrow resonant wavelength bands achieved by the ring resonator mirror of the WTL of FIG. 3.

(achieved through constructive interference within the Mach-Zehnder interferometer) and a pair of opposing reduced signal portions 228 and 230 (caused be destructive interference within the interferometer). The wavelength of the center peak depends upon internal dimensions of the interferometer to be described in greater detail below. The set of sharp resonant peaks permitted by the ring resonator is shown in FIG. 5. The set of sharp peaks 232 arises as a result of selective reflection characteristics of the ring resonator. The wavelengths of the sharp peaks and their relative spacing depend upon internal dimensions of the ring resonator also to be described in greater detail below.

Figure 6:
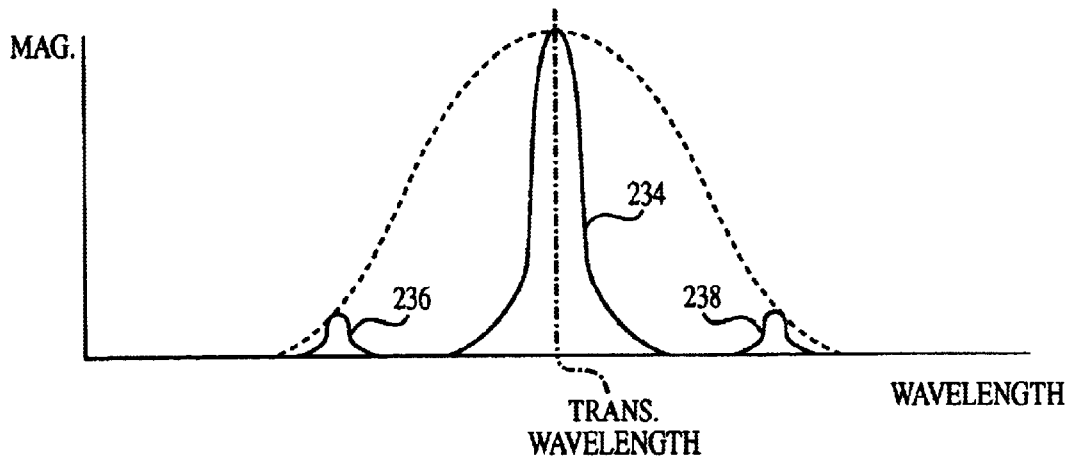
FIG. 6 is a graph illustrating a resulting output wavelength spectrum achieved using the combination of the Mach-Zehnder interferometer and the ring resonator mirror of the WTL of FIG. 3.

Referring again to FIG. 3, wide tuning control unit 220 controls the Mach-Zehnder interferometer to center the wide tuning profile at a selected ITU C band channel wavelength within the tuning range of the gain chip. Fine tuning control unit 222 controls the ring resonator mirror to center one of the sharp resonant peaks at the same ITU C band channel wavelength. The sharp peak corresponding to the selected C band channel wavelength resonates freely within the laser cavity whereas the sideband peaks permitted by the ring resonator mirror (i.e. transmission side bands) are substantially filtered by the Mach-Zehnder interferometer to greatly limit resonance thereof in the laser cavity. The resulting laser emission spectrum is shown in FIG. 6 wherein a single sharp peak 234 appears at the selected wavelength and adjacent sharp peaks 236 and 238 appear as diminished side bands. Preferably, the Mach-Zehnder interferometer and the other laser cavity components are configured so that when properly tuned, sideband peaks 236 and 238 are held at least 30 dB below the level of sharp peak 234. The actual level of the sidebands emitted by WTL depends not only on the shape of the wide tuning profile but on the combined characteristics of the gain chip and tuning cavity. Hence, the wide tuning profile need not necessarily account for the full 30 dB difference and exact alignment of the sidebands with reduced portions 228 and 230 is not necessarily optimal in all cases. As an example, for a typical InGaAsP gain chip, the Mach-Zehnder interferometer need only cause a 2% reduction of the unwanted ring resonances to achieve the desired 30 dB side mode suppression. For any particular application, routine experimentation is performed to determine optimal fabrication and operational characteristics for the WTL.

Figure 1:
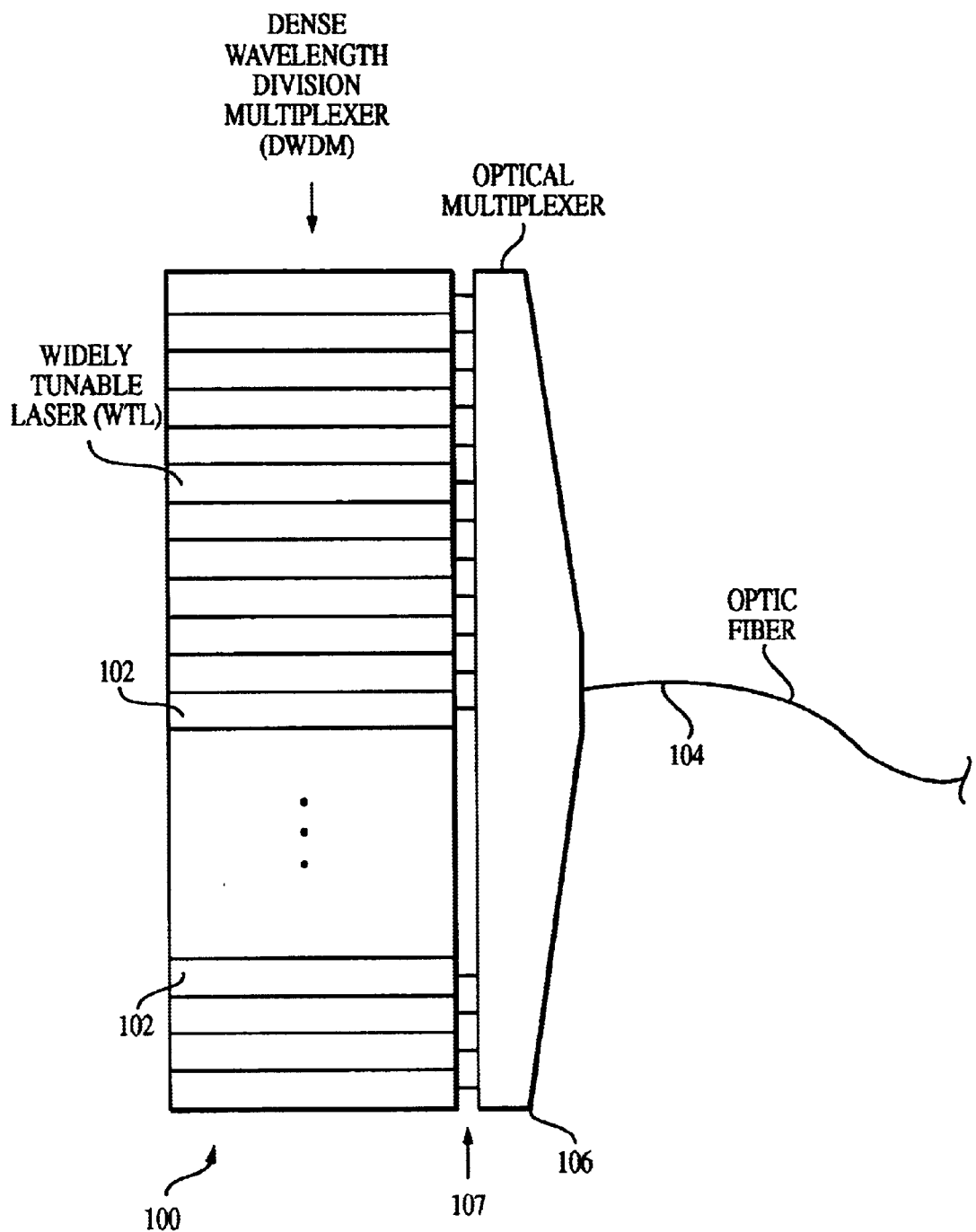
FIG. 1 illustrates a DWDM configured in accordance with the prior art.

Referring once more to FIG. 3, after the laser is permitted to resonate sufficiently to generate a coherent optical beam at the selected wavelength, the coherent beam is output from the gain chip of the WTL through optic fiber 224 for use by the DWDM. The coherent optical signal may be modulated, by devices not shown, to encode information therein for output via intermediate optic fiber 207 (FIG. 1) and ultimately for transmission via optic fiber 204 (also FIG. 1) along with other coherent optical communication signals at other ITU C band channels. By configuring and tuning the WTL so that the sidebands are at least 30 dB below the level of signals at the selected channel wavelength, error rates in the transmission of information encoded within the coherent optical communication signal are kept below $10^{-9}$.

To ensure that the optical signal remains fixed precisely at the selected C band channel wavelength and that the sidebands remain at levels 30 dB lower, a feedback system is provided for providing feedback to wide tuning control unit 220 and fine tuning control unit 222. The feedback system includes a splitter connected to optical fiber 224 for splitting off a portion of the optical signal output from laser cavity 210 to a wavelength detector 239, which provides a feedback signal to wide tuning control unit 220 and fine tuning control unit 222. The feedback signal indicates the actual wavelength of the output signal. If the actual wavelength begins to deviate from the selected C band channel wavelength, fine tuning control unit 222 automatically adjusts the ring resonator portion of tuning chip 214 so as to maintain the wavelength of sharp resonant peak 234 (FIG. 6) at the selected C band channel wavelength. Wide tuning control unit 220 also automatically adjusts the Mach-Zehnder interferometer portion of the tuning chip so as to maintain center wavelength 226 (FIG. 4) of the broad tuning profile peak at the selected wavelength. Additionally, feedback may be provided to the gain chip control unit.

Thus a feedback system is described for providing feedback to the wide tuning control unit and the fine tuning control unit. Depending upon how quickly and significantly the output transmission wavelength varies, feedback may be provided substantially in real-time or may be provided only once per day or per week. In other implementations, no feedback at all is provided. Rather, the levels of the control signals applied to the gain chip, Mach-Zehnder interferometer and ring resonator are set once so as to achieve a selected absolute output wavelength and are not adjusted again unless the output wavelength is to be changed from one ITU channel to another. Techniques for quickly and efficiently determining the appropriate levels for laser control signals so as to achieve particular output wavelengths is described in co-pending U.S. patent application "*Method And Apparatus For Determining Transmission Wavelengths For Lasers In A Dense Wavelength Division Multiplexer*" of Randy May, Ser. No. 09/685,212 filed Oct. 10, 2000, which is assigned to the assignee of the present patent application and incorporated by reference herein.

Figure 7:
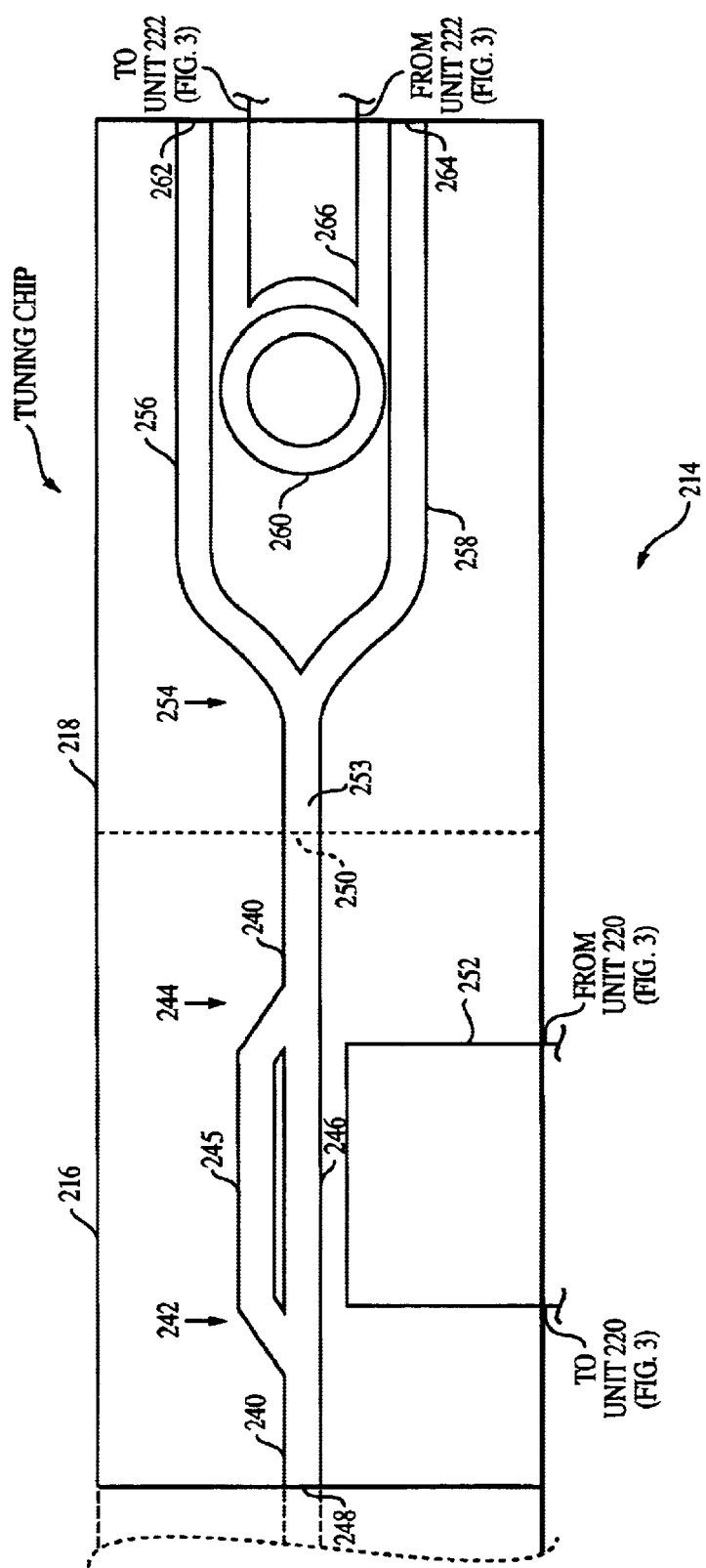
FIG. 7 is a top view of a tuning chip of the hybrid WTL of FIG. 3 illustrating optical channels of the tuning chip.
Figure 8:
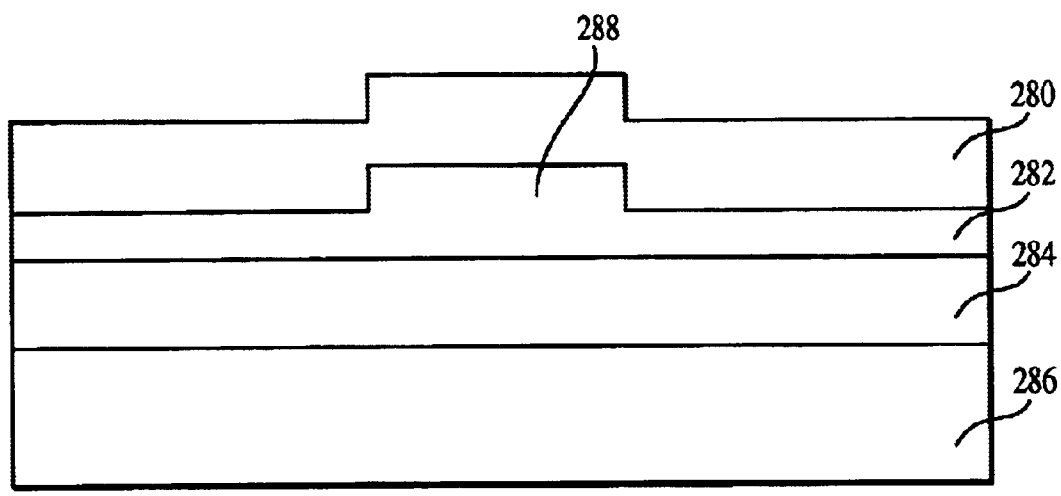
FIG. 8 is a cross-sectional view of a wave guide structure appropriate for use as the tuning chip of FIG. 7.

Referring now to FIG. 7, an exemplary implementation of the tuning chip of the hybrid laser will now be described. Tuning chip 214 is a generally planar optical light circuit chip having channels (rib-loaded wave guides) therein configured to permit propagation of optical signals. FIG. 7 shows the configuration of the channels within the tuning chip. A cross section of a portion of a wave guide structure having a single channel is depicted in FIG. 8. The wave guide (channel) is formed from a stack of dielectrics such as a silicon dioxide layer 280 followed by a silicon oxynitride layer 282 followed by another silicon dioxide layer 284 deposited on a silicon substrate 286. The silicon oxynitride layer, which is the core of the chip, possesses light guiding properties because its index of refraction is greater than that of the adjacent silicon dioxide layers. Lateral guiding is accomplished by creating a rib 288 in the top portion of the core. In one example, silicon dioxide layer 280 is 1 $\mu$m in width, silicon oxynitride layer 282 is 0.5 $\mu$m in width, silicon dioxide layer 284 is 5 $\mu$m in width and silicon substrate 286 is 0.3 millimeters in width. Rib or ridge 288 extends 600 Angstroms above other portions of layer 282. The representations of the channels in FIGS. 7 and 8 are not necessarily to scale.

Referring again to the entire tuning chip of FIG. 7, the Mach-Zehnder interferometer portion 216 of the tuning chip includes a main channel 240 and a pair of splitters 242 and 244 splitting the main channel into separate inner channels 245 and 246 of differing length. Main channel 240 is coupled at a first end 248 to an optical channel of the gain chip (shown in phantom lines) and is coupled at a second end 250 to an input optical channel of ring resonator mirror portion 218. With this configuration, coherent light propagating through the Mach-Zehnder interferometer (regardless of propagation direction) is split onto inner channels 245 and 246 then recombined. The recombined signals may be out of phase with respect to one another depending upon the wavelength of light and by the difference in length between channels 245 and 246. If completely out of phase, the light from channel 245 destructively interferes with the light from channel 246 to substantially eliminate that wavelength of light. If completely in phase, the light from channel 245 constructively interferes with the light from channel 246 to substantially increase the magnitude of that wavelength of light. Thus, the wide tuning interference profile as illustrated in FIG. 4 is produced and resonance within the laser cavity is limited by the wide tuning interference profile.

The tuning chip is fabricated to have a nominal channel length difference of about 20 µm so as to provide optical interference resulting in a wide tuning profile having a center wavelength 226 (FIG. 4) of 1550 nm and a width (defined as the wavelength difference between portions 228 to 230 of FIG. 4) of about 41 nm. A heating element 252 is provided in the tuning chip to heat the chip so as to vary the channel length and refractive index difference to adjust the center wavelength within the range of 1525 nms to 1565 nms to thereby permit the wide tuning profile to be centered on any of the ITU C band channel wavelengths. The heating element may be, for example, a resistive element formed on top of the wave guide structure directly above channels 245 and 246. The application of heat to channels 245 and 246 will vary the relative channel length difference and mode propagation indexes. Wide tuning control unit 220 (FIG. 3) controls an amount of current conducted through the resistive heating element so as to set the center wavelength to a selected wavelength value. In one example, applying 300 mW of heat to one channel is sufficient to vary the center wavelength of the wide tuning profile through the full range from 1525 nm to 1565 nm.

The ring resonator portion 218 of the tuning chip includes a main channel 253 and a Y-section 254 splitting the main channel into separate inner channels 256 and 258 that run parallel to one another along opposing sides of a channel ring 260. An inner end of main channel 253 of the ring resonator is coupled to outer end 250 of main channel 244 of the Mach-Zehnder interferometer. Parallel channels 256 and 258 are sufficiently close to adjacent tangential portions of channel ring 260 to permit evanescent coupling between the ring channel and the parallel channels. With this configuration, light entering main channel 253 from the Mach-Zehnder interferometer is split into equal portions propagating outward along parallel channels 256 and 258. The portion propagating along channel 256 triggers clockwise propagation of light within ring channel 260, but only within narrow ranges of predetermined wavelengths. The light propagating clockwise in the ring, in turn, triggers inward propagation of light along channel 258 also within the narrow ranges of predetermined wavelengths. Likewise, the portion propagating outward along channel 258 triggers counter-clockwise propagation of light within ring channel 260 within narrow ranges of predetermined wavelengths which, in turn, triggers inward propagation of light along channel 256 also at the predetermined frequencies. The inward propagating signals are combined by Y-section 254 into a single optical beam along main channel 253 for output back into the Mach-Zehnder interferometer. In this manner, light is reflected by the ring resonator back into the Mach-Zehnder interferometer, but only within narrow ranges of predetermined wavelengths. Hence, resonance within the laser cavity can only arise within the narrow ranges of predetermined frequencies permitted by the ring resonator and is further limited by the wide tuning profile of the Mach-Zehnder interferometer, thus achieving the single sharp resonance peak illustrated in FIG. 6. Note that outer ends 262 and 264 of parallel channels 256 and 258 are coupled out of the tuning chip. Hence, any light at frequencies other than the predetermined frequencies is merely discharged from the tuning chip.

The predetermined frequencies depend upon the diameter of the ring channel. The tuning chip is fabricated to have a nominal ring channel diameter of about 300 µm so as to reflect light at sharp peaks having a free spectral range of about 1.5 nm (defined as the wavelength differences between adjacent spikes of FIG. 5). A heating element 266 is provided in the tuning chip to heat the chip so as to vary the diameter of the ring to adjust the wavelengths of the peaks through the free spectral range of 1.5 nm to thereby permit one of the peaks to be centered on any of the ITU C band channel wavelengths. The heating element may be a resistive element formed on top of the wave guide structure directly above of ring channel 260. Heating causes changes in the diameter and the mode index of the ring. In one example, application of 30 mW of heat produces an effect sufficient to vary the sharp peaks through the free spectral range of 1.5 nms.

In the implementation of FIG. 7, wherein the Mach-Zehnder interferometer and the ring resonator are adjusted by heating portions of the tuning chip, the wide tuning and fine tuning control units (FIG. 3) may be configured as circuits configured to vary the amount of current applied to the resistive heating elements so as to increase or decrease heating based on the wavelength feedback provided. The maximum tuning range for the device can be obtained through appropriate thermal adjustment of the three tuning sections (gain section, Mach-Zehnder section, and ring resonator section). Simultaneous tuning in this manner requires appropriate calibration of the thermal response of the tuning sections and characterization of their interactions.

What has been described are exemplary embodiments of a hybrid WTL for use within a DWDM for generating ITU C band channels. Principles of the invention, however, may be applied to other lasers or optical devices for use in other applications. Accordingly, the invention is not intended to be limited to the embodiments shown herein but is to be accorded the widest scope consistent with the principles and novel features disclosed herein. The exemplary embodiments have been primarily described with reference to block diagrams illustrating pertinent components of the embodiments. It should be appreciated that not all components of a complete implementation of a practical system are necessarily illustrated or described in detail. Rather, only those components necessary for a thorough understanding of the invention have been illustrated and described in detail. Actual implementations may contain more components or, depending upon the implementation, fewer components.

What is claimed is:

1. A semiconductor laser having a cavity comprised of:
    a gain chip for providing radiant energy within the cavity;
    an interferometric wide tuning port for generating resonances within the cavity and having at least two interferometric optical channels, with at least one of the interferometric optical channels having an adjustable length, to selectively generate resonances at selectable wavelengths, wherein the interferometric wide tuning port has a coarse tuning profile to generate a broad peak for limiting the radiant energy generated by the gain chip to a single broad peak;
    a ring resonator for generating resonances within the cavity and receiving radiant energy with a single broad peak from the interferometric wide tuning port, having a ring-shaped optical channel with an adjustable diameter and at least two ring resonator channels, wherein the at least two ring resonator channels are formed sufficiently close to opposing sides of the ring-shaped optical channel to selectively permit evanescent coupling of radiant energy propagating therein at frequencies dependent upon the diameter of the ring-shaped optical channel, wherein the ring resonator has a fine tuning profile to generate a set of sharp peaks which further limit resonances within the cavity; and wherein the interferometric tuning port aligns a wavelength of the broad peak of the coarse tuning profile at a selected wavelength and the ring resonator is aligned to a wavelength of one of the sharp peaks also at the selected wavelength so that the ring resonator may reflect light having a sharp peak at the selected wavelength through the interferometric wide tuning port and the gain chip for emission by the laser.

2. The semiconductor laser of claim 1 wherein the gain chip is formed on a III/IV material chip.

3. The semiconductor laser of claim 1 wherein the interferometric tuning port is a Mach-Zehnder interferometer.

4. The semiconductor laser of claim 3 wherein the Mach-Zehnder interferometer comprises:
an input optical channel;
a splitter for splitting the input optical channel into the at least two interferometric optical channels;
wherein the at least two interferometric optical channels are of differing lengths; and
a combining section for combining the at least two interferometric optical channels into a single output channel.

5. The semiconductor laser of claim 4 further comprising a wide tuning control unit configured to adjust an optical path length difference between the at least two interferometric optical channels of the Mach-Zehnder interferometer to maintain alignment of the broad peak of the wide tuning profile with the selected wavelength.

6. The semiconductor laser of claim 5 further comprising a heating element configured to thermally adjust the optical path length difference of the at least two interferometric optical channels.

7. The semiconductor laser of claim 5 further comprising a wavelength detector coupled to the wide tuning control unit configured to detect the wavelength of a signal output by the laser.

8. The semiconductor laser of claim 3 wherein the Mach-Zehnder interferometer is formed on a separate planar wave guide chip.

9. The semiconductor laser of claim 1 wherein the ring resonator further comprises:
an input optical channel;
a splitter for splitting the input optical channel into the at least two channels; and
wherein the pair of channels formed sufficiently close to opposing sides of the ring-shaped optical channel to permit evanescent coupling of radiant energy propagating therein.

10. The semiconductor laser of claim 9 further including a fine tuning control unit configured to adjust the diameter of the ring-shaped optical channel to maintain alignment of one of the sharp peaks at the selected wavelength.

11. The semiconductor laser of claim 10 further comprising a heating element configured to thermally adjust resonance frequencies of the ring-shaped optical channel.

12. The semiconductor laser of claim 10 further comprising a wavelength detector coupled to the fine tuning control unit configured to detect the wavelength of a signal output by the laser.

13. The semiconductor laser of claim 9 wherein a difference in length between the pair of channels is approximately 20 $\mu$m.

14. The semiconductor laser of claim 1 wherein the ring resonator is formed using planar wave guides.

15. The semiconductor laser of claim 1 further comprising a gain chip control unit configured to control the output of the gain chip.

16. The semiconductor laser of claim 1 wherein an intensity emitted by the laser at the selected wavelength is 30 dB greater than sideband wavelengths emitted by the laser.

17. The semiconductor laser of claim 1 wherein the ring resonator has a diameter of approximately 300 $\mu$m.

18. The semiconductor laser of claim 1 wherein the sharp resonance peaks generated by the ring resonator have a spacing of approximately 1.5 nm.

19. The semiconductor laser of claim 1 wherein the gain chip is an InGaAsP gain chip.

20. The semiconductor laser of claim 1 wherein the inteferometric wide tuning port and the ring resonator are provided on a tuning chip having a plurality of channels, wherein each channel is formed from stacks of dielectric material.

21. The semiconductor laser of claim 20 further comprising a silicon substrate and wherein the stacked dielectric material comprises a first layer of silicon dioxide mounted on the silicon substrate, a layer of silicon oxynitride deposited on the first layer of silicon dioxide, and a second layer of silicon dioxide deposited on the layer of silicon oxynitride.

22. The semiconductor laser of claim 21 wherein the layer of silicon oxynitride comprises a first rib portion on a side opposite from the silicon substrate abutting outwards from the silicon; and wherein the second layer of silicon dioxide is deposited on the silicon oxynitride to form a second rib portion on a side opposite from the silicon abutting outwards from the silicon substrate.

23. The semiconductor laser of claim 22 wherein the width of the silicon substrate is approximately 0.3 mm, the width of the first layer of silicon dioxide is approximately 5 $\mu$m, the width of the layer of silicon oxynitride layer is approximately 0.5 $\mu$m, and the width of the second layer of silicon dioxide is approximately 1 $\mu$m in width.

24. The semiconductor laser of claim 22 wherein the first rib portion extends approximately 600 Angstroms from other portions of the layer of silicon oxynitride.

25. The semiconductor laser of claim 1 wherein the width of the broad peak is approximately 41 nm.

26. The semiconductor laser of claim 1 wherein the interferometric wide tuning port and the ring resonator are provided on a silicon tuning chip.

27. The semiconductor laser of claim 26 wherein the silicon tuning chip comprises a unitary structure of silicon.

28. The semiconductor laser of claim 1 further comprising:
first heating means for heating the interferometric wide tuning port; and
second heating means for heating the ring resonator.

29. A semiconductor laser having a cavity comprised of:
means for providing radiant energy and gain for resonances within the cavity;
wide tuning means for generating resonances within the cavity based on a wide tuning profile having a broad peak having at least two interferometric optical channels with at least one of the interferometric optical channels having an adjustable length to selectively interfere resonances generated by the gain chip; and fine tuning means for further limiting resonances within the cavity to within a set of sharp resonance peaks having a ring-shaped optical channel with an adjustable diameter and at least two fine tuning channels, wherein the at least two channels are formed sufficiently close to opposing sides of the ring-shaped optical channel to selectively permit evanescent coupling of radiant energy therein at frequencies dependent upon the diameter of the ring-shaped optical channel; and wherein the wide tuning means is configured to align a wavelength of the broad peak of the wide tuning profile at a selected wavelength and the fine tuning means configured to align a wavelength of one of the sharp peaks also at the selected wavelength so that the fine tuning means may reflect light having a sharp peak at the selected wavelength through the wide tuning means and the means for providing radiant energy for emission by the laser.

30. The semiconductor laser of claim 29 wherein the means for providing radiant energy and gain is a gain chip.

31. The semiconductor laser of claim 30 wherein the gain chip is formed on a III/IV material chip.

32. The semiconductor laser of claim 29 wherein the wide tuning means is a Mach-Zehnder interferometer.

33. The semiconductor laser of claim 32 wherein the Mach-Zehnder interferometer comprises:

an input optical channel;

a splitter for splitting the input optical channel into he at least two interferometric optical channels of differing lengths; and a combining section for combining the at least two interferometric optical channels into a single output channel.

34. The semiconductor laser of claim 33 further including means for controlling the wide tuning means to adjust an optical path length difference between the at least two interferometric optical channels of the Mach-Zehnder interferometer so as to maintain alignment of the broad peak of the wide tuning profile with a selected wavelength.

35. The semiconductor laser of claim 24 wherein the means for adjusting an optical path length difference of the at least two interferometric optical channels includes a heating element.

36. The semiconductor laser of claim 32 wherein the Mach-Zehnder interferometer is formed on a separate planar wave guide chip.

37. The semiconductor laser of claim 29 wherein the fine tuning means is a ring resonator.

38. The semiconductor laser of claim 37 wherein the ring resonator comprises:

an input optical channel;

a splitter for splitting the input optical channel into the at least two fine tuning channels; and wherein the at least two fine tuning channels are formed sufficiently close to opposing sides of the ring-shaped optical channel to permit evanescent coupling of radiant energy propagating therein.

39. The semiconductor laser of claim 38 further including means for controlling the fine tuning means includes means to adjust the length of the ring-shaped optical channel so as to maintain alignment of one of the sharp peaks at the selected wavelength.

40. The semiconductor laser of claim 39 wherein the means for adjusting resonance frequencies of the ring-shaped optical channel includes a heating element.

41. The semiconductor laser of claim 37 wherein the ring resonator is formed using planar wave guides.

42. A method for operating a semiconductor laser having a cavity formed from a gain chip, a Mach-Zehnder interferometer and a ring resonator, comprising the steps of:

controlling the gain chip to provide radiant energy for resonance within the cavity;

controlling the Mach-Zehnder interferometer to limit resonance within the cavity based on a wide tuning profile having a broad peak set to a selected wavelength, wherein the Mach-Zehnder interferometer includes a pair of optical channels of differing lengths and wherein the step of controlling the Mach-Zehnder interferometer is performed by adjusting an optical path length difference between the pair of optical channels; and controlling the ring resonator to further limit resonance within the cavity to within a set of sharp resonance peaks, with a wavelength of one of the sharp peaks also set to the selected wavelength, wherein the ring resonator includes a ring-shaped optical channel and wherein the step of adjusting the ring resonator is performed by adjusting one or more of a diameter and a refractive index of the ring-shaped optical channel.

43. The method of claim 42 wherein the step of adjusting an optical path length difference between the pair of optical channels is performed by heating the Mach-Zehnder interferometer.

44. The method of claim 42 wherein the step of adjusting the ring-shaped optical channel is performed by heating the ring resonator.

45. The method of claim 42 further including the steps of outputting an optical beam from the semiconductor laser cavity;

detecting a wavelength of the output beam;

controlling the Mach-Zehnder interferometer to maintain alignment of the broad peak of the wide tuning profile with the selected wavelength; and controlling the ring resonator to maintain alignment of one of the sharp resonance peaks at the selected wavelength.

46. The method of claim 42 further including the step of adjusting the gain chip, the Mach-Zehnder interferometer and the ring resonator to provide a maximum tuning range.

47. The method of claim 46 wherein the gain chip, the Mach-Zehnder interferometer and the ring resonator are each thermally-adjustable and wherein the step of adjusting the gain chip, the Mach-Zehnder interferometer and the ring resonator to provide a maximum tuning range includes the steps of:

separately determining individual thermal response characteristics of the gain chip, the Mach-Zehnder interferometer and the ring resonator;

determining thermal response interactions among the gain chip, the Mach-Zehnder interferometer and the ring resonator;

determining separate amounts of thermal energy to apply to the gain chip, the Mach-Zehnder interferometer and the ring resonator to achieve the maximum tuning range based on the individual thermal response characteristics and on the thermal response interactions; and simultaneously applying the separate amounts of thermal energy to the gain chip, the Mach-Zehnder interferometer and the ring resonator to thereby achieve the maximum tuning range.

48. A laser multiplexer system comprising:

a plurality of lasers each operative to generate a respective laser beam; and an optical multiplexer operative to combine the plurality of laser beams into an optic fiber for transmission; and wherein each laser has a cavity comprised of:

a gain chip for providing radiant energy within the cavity;

an interferometric wide tuning port for generating resonances within the cavity and having at least two interferometric optical channels, with at least one of the interferometric optical channels having an adjustable length, to selectively generate resonances at selectable wavelengths, wherein the interferometric wide tuning port has a coarse tuning profile to generate a broad peak for limiting the radiant energy generated by the gain chip to a single broad peak;

a ring resonator for generating resonances within the cavity and receiving radiant energy with a single broad peak from the interferometric wide tuning port, having a ring-shaped optical channel with an adjustable diameter and at least two ring resonator channels, wherein the at least two ring resonator channels are formed sufficiently close to opposing sides of the ring-shaped optical channel to selectively permit evanescent coupling of radiant energy propagating therein at frequencies dependent upon the diameter of the ring-shaped optical channel, wherein the ring resonator has a fine tuning profile to generate a set of sharp peaks which further limit resonances within the cavity; and wherein the interferometric tuning port aligns a wavelength of the broad peak of the coarse tuning profile at a selected wavelength and the ring resonator is aligned to a wavelength of one of the sharp peaks also at the selected wavelength so that the ring resonator may reflect light having a sharp peak at the selected wavelength through the interferometric wide tuning port and the gain chip for emission by the laser.

* * * * *